(12) United States Patent
Daly et al.

(10) Patent No.: US 9,923,161 B1
(45) Date of Patent: Mar. 20, 2018

(54) HIGH-EFFICIENCY SOLAR ENERGY DEVICE

(71) Applicant: Lockheed Martin Corporatione, Bethesda, MD (US)

(72) Inventors: Gregory T. Daly, Glendora, NJ (US); Michael P. Whelan, Hainesport, NJ (US); Robert C. Bowen, Jr., Mt. Laurel, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/858,501

(22) Filed: Sep. 18, 2015

Related U.S. Application Data

(62) Division of application No. 13/667,170, filed on Nov. 2, 2012.

(60) Provisional application No. 61/554,773, filed on Nov. 2, 2011.

(51) Int. Cl.
*H01L 31/00* (2006.01)
*H01L 51/44* (2006.01)
*H01L 51/42* (2006.01)
*H01L 31/0256* (2006.01)
*H01L 31/068* (2012.01)
*H01L 31/0304* (2006.01)

(52) U.S. Cl.
CPC ........ *H01L 51/447* (2013.01); *H01L 51/4213* (2013.01); *H01L 31/03044* (2013.01); *H01L 31/068* (2013.01); *H01L 2031/0344* (2013.01); *Y02E 10/00* (2013.01)

(58) Field of Classification Search
CPC ......... H01L 31/03044; H01L 31/03048; H01L 51/4213; H01L 51/4253; H01L 31/072; H01L 31/068; H01L 51/426; H01L 51/447
USPC .................................................. 136/243–265
See application file for complete search history.

(56) References Cited

U.S. PATENT DOCUMENTS

| | | |
|---|---|---|
| 4,931,412 A | 6/1990 | Fischer et al. |
| 7,217,882 B2 | 5/2007 | Walukiewicz et al. |
| 2003/0204038 A1 | 10/2003 | Xiao et al. |
| 2003/0227048 A1 | 12/2003 | Asakawa et al. |
| 2004/0050816 A1 | 3/2004 | Asakawa et al. |
| 2005/0192364 A1 | 9/2005 | Lichenhan et al. |
| 2005/0253502 A1 | 11/2005 | Gokturk |
| 2006/0219287 A1 | 10/2006 | Huang |
| 2006/0231525 A1 | 10/2006 | Asakawa et al. |
| 2007/0151597 A1 | 7/2007 | Chen et al. |
| 2008/0051512 A1 | 2/2008 | Wei et al. |
| 2009/0027603 A1 | 1/2009 | Samulski et al. |
| 2009/0130380 A1 | 5/2009 | Asakawa et al. |

(Continued)

OTHER PUBLICATIONS

Brandhorst, Jr., "A POSS Coating for Thin Film Solar Cells", pp. 778-781.

(Continued)

*Primary Examiner* — Niki Bakhtiari
(74) *Attorney, Agent, or Firm* — Howard IP Law Group

(57) ABSTRACT

A high-efficiency solar cell including an Indium, Gallium, Aluminum and Nitrogen (in a combination comprising InGaN, or InAlN, or InGaAlN) alloy which may be blended with a polyhedral oligomeric silsesquioxane (POSS) material, and which may include an absorption-enhancing layer including one of more of carbon nanotubes, quantum dots, and undulating or uneven surface topography.

12 Claims, 10 Drawing Sheets

(56) References Cited

U.S. PATENT DOCUMENTS

| | | |
|---|---|---|
| 2009/0250113 A1* | 10/2009 | Sun ..................... H01L 31/028 |
| | | 136/261 |
| 2010/0003143 A1 | 1/2010 | Welser |
| 2011/0023958 A1* | 2/2011 | Masson ............... H01L 31/0201 |
| | | 136/256 |
| 2011/0089385 A1 | 4/2011 | Wada et al. |
| 2011/0092661 A1 | 4/2011 | Lichtenhan et al. |
| 2012/0132930 A1* | 5/2012 | Young ................. H01L 31/0481 |
| | | 257/84 |

OTHER PUBLICATIONS

Roach, John, "A Blacker Black: Darkest Known Material Created", National Geographic News, Jan. 24, 2008.
Solar Energy Materials Research Group, Lawrence Berkeley National Laboratory/Material Sciences Division.

\* cited by examiner

HIGH-EFFICIENCY SOLAR ENERGY DEVICE

CROSS-REFERENCE TO RELATED APPLICATION

This application is a divisional application of U.S. patent application Ser. No. 13/667,170, now issued U.S. Pat. No. 9,373,734, entitled HIGH EFFICIENCY SOLAR ENERGY DEVICE, filed Nov. 2, 2012, and claims the benefit of and priority to U.S. Provisional Patent Application Ser. No. 61/554,773, filed Nov. 2, 2011, the entire disclosures of which are incorporated by reference herein for all purposes.

FIELD OF THE INVENTION

The present invention relates generally to solar energy devices, and more particularly, to high-efficiency semiconductor-based solar cells.

BACKGROUND

Solar energy is a vast and inexhaustible resource. Capturing and utilizing this resource is a primary focus of numerous commercial and federal agencies. This focus is further prioritized by rising fossil fuel costs, the depletion of fossil fuel reserves and stimulus initiatives for alternate energy sources. The creation of a highly efficient solar energy semiconductor device will provide a renewable energy transition platform taking full advantage of this natural resource.

Several technological challenges exist in order realize higher efficiency solar capture devices, such as semiconductor-based solar cells. For example, these solar cells must expand their operating band gap energy range. This generally refers to the energy difference (measured in electron volts (eV)) between the top of the Valence Band (which is the highest range of electron energies where electrons are normally present) and the bottom of the Conduction Band (the electron energy range that is sufficient to free an electron from binding with its individual atom). Combined with band gap energy, efficient solar device designs may take into account the varying speeds of photons. By choosing the optimal semiconductor material, the solar energy device can focus on the widest possible band gap range, thereby collecting the largest range of photonic energy. Further, improved grain boundary properties may be required for increased strength. As solar energy devices typically experience thermal stresses, understanding a solar material grain boundary is vital to prevent material distortion. Acting as the interface between two grains in a polycrystalline material, the grain boundary can disrupt the motion of impurities/dislocations caused by energy transfer so as to reduce/optimize crystallite size improving material strength. Finally, the ability of a solar device to collect photons (without significant energy reflection) correlates device efficiency with energy absorption rates to maximize the number of "donor"/"acceptor" exchanges that take place to generate electrical energy.

Improved systems and methods for collecting solar energy addressing each of these characteristics are desired.

SUMMARY

According to an aspect of the present invention, there is disclosed a solar cell comprising: a substrate; at least one active layer formed of Indium Gallium Nitride (InGaN), or at least one active layer formed of Indium Aluminum Nitride (InAlN), or at least one active layer formed of Indium Gallium Aluminum Nitride (InGaAlN) and at least one of a polyhedral oligomeric silsesquioxane (POSS) material; and an absorption-enhancing layer for increasing photon propagation into the at least one active layer.

The substrate may comprise a material such as silicon carbide (SiC), sapphire, gallium nitride (GaN) or aluminum nitride (AlN) by way of non-limiting example. The InGaN, or an InAlN or an InGaAlN active semiconductor layer absorbs photon energy within specific overlapping energy bands to enable increased photon energy absorption in the UV range.

A POSS material may be introduced into the InGaN, or an InAlN or an InGaAlN alloy for improving photocurrent energy flow, reducing alloy dislocations, aligning grain boundaries and increasing alloy strength. The InGaN, or InAlN or InGaAlN active layer may be advantageously restructured by the inclusion of POSS material to form a more uniform and symmetric active layer.

An absorption enhancing layer may be disposed on the top surface of the active layer and include carbon nanotubes (CNTs) and/or quantum dots configured thereon.

Multi-Junction Devices

Embodiments of the invention may include multi-junction semiconductor devices, and methods of manufacture thereof. By way of non-limiting example, such devices include:

An InGaN, or an InAlN or an InGaAlN multi-junction Advanced Solar Energy Converter (ASEC) device manufactured/grown employing energetic neutral atom beam epitaxy and metal deposition or similar epitaxial growth method.

An InGaN, or an InAlN or an InGaAlN multi-junction ASEC device manufactured/grown employing energetic neutral atom beam epitaxy and metal deposition, containing enhanced Indium/Gallium/Aluminum grain boundary pinning.

An InGaN, or an InAlN or an InGaAlN multi-junction ASEC device manufactured/grown employing energetic neutral atom beam epitaxy and metal deposition, containing enhanced Indium/Gallium/Aluminum grain boundary pinning, utilizing specifically engineered, optimized blend of 1% to 10% by weight POSS.

An InGaN, or an InAlN or an InGaAlN multi-junction ASEC device manufactured/grown employing energetic neutral atom beam epitaxy and metal deposition, containing enhanced Indium/Gallium/Aluminum grain boundary pinning, utilizing specifically engineered, optimized blend of 1% to 10% by weight POSS, and deposition of a strategically oriented quantum dot matrix.

An InGaN, or an InAlN or an InGaAlN multi-junction ASEC device manufactured/grown employing energetic neutral atom beam epitaxy and metal deposition, containing enhanced Indium/Gallium/Aluminum grain boundary pinning, utilizing specifically engineered, optimized blend of 1% to 10% by weight POSS, and deposition of a strategically oriented quantum dot matrix and tunnel junction electrical contact comprised of specific InN enhanced doping.

An InGaN, or an InAlN or an InGaAlN multi-junction ASEC device manufactured/grown employing energetic neutral atom beam epitaxy and metal deposition, containing enhanced Indium/Gallium/Aluminum grain boundary pinning, utilizing specifically engineered, optimized blend of 1% to 10% by weight POSS, and tunnel junction electrical contact comprised of specific InN enhanced doping.

An InGaN, or an InAlN or an InGaAlN multi-junction ASEC device manufactured/grown employing energetic neutral atom beam epitaxy and metal deposition, containing enhanced Indium/Gallium/Aluminum grain boundary pinning and deposition of a strategically oriented quantum dot matrix.

An InGaN, or an InAlN or an InGaAlN multi-junction ASEC device manufactured/grown employing energetic neutral atom beam epitaxy and metal deposition, containing enhanced Indium/Gallium/Aluminum grain boundary pinning, deposition of a strategically oriented quantum dot matrix and tunnel junction electrical contact comprised of specific InN enhanced doping.

An InGaN, or an InAlN or an InGaAlN multi-junction ASEC device manufactured/grown employing energetic neutral atom beam epitaxy and metal deposition, containing enhanced Indium/Gallium/Aluminum grain boundary pinning and tunnel junction electrical contact comprised of specific InN enhanced doping.

An InGaN, or an InAlN or an InGaAlN multi-junction ASEC device manufactured/grown employing energetic neutral atom beam epitaxy and metal deposition, utilizing specifically engineered, optimized blend of 1% to 10% by weight POSS.

An InGaN, or an InAlN or an InGaAlN multi-junction ASEC device manufactured/grown employing energetic neutral atom beam epitaxy and metal deposition, utilizing specifically engineered, optimized blend of 1% to 10% by weight POSS and deposition of a strategically oriented quantum dot matrix.

An InGaN, or an InAlN or an InGaAlN multi-junction ASEC device manufactured/grown employing energetic neutral atom beam epitaxy and metal deposition, utilizing specifically engineered, optimized blend of 1% to 10% by weight POSS, deposition of a strategically oriented quantum dot matrix and tunnel junction electrical contact comprised of specific InN enhanced doping.

An InGaN, or an InAlN or an InGaAlN multi-junction ASEC device manufactured/grown employing energetic neutral atom beam epitaxy and metal deposition, utilizing specifically engineered, optimized blend of 1% to 10% by weight POSS and tunnel junction electrical contact comprised of specific InN enhanced doping.

An InGaN, or an InAlN or an InGaAlN multi-junction ASEC device manufactured/grown employing energetic neutral atom beam epitaxy and metal deposition and containing deposition of a strategically oriented quantum dot matrix.

An InGaN, or an InAlN or an InGaAlN multi-junction ASEC device manufactured/grown employing energetic neutral atom beam epitaxy and metal deposition, containing deposition of a strategically oriented quantum dot matrix and tunnel junction electrical contact comprised of specific InN enhanced doping.

An InGaN, or an InAlN or an InGaAlN multi-junction ASEC device manufactured/grown employing energetic neutral atom beam epitaxy and metal deposition and containing tunnel junction electrical contact comprised of specific InN enhanced doping.

An InGaN, or an InAlN or an InGaAlN multi-junction ASEC device manufactured/grown employing energetic neutral atom beam epitaxy method.

An InGaN, or an InAlN or an InGaAlN multi-junction ASEC device manufactured/grown employing energetic neutral atom beam epitaxy, containing enhanced Indium/Gallium/Aluminum grain boundary pinning.

An InGaN, or an InAlN or an InGaAlN multi-junction ASEC device manufactured/grown employing energetic neutral atom beam epitaxy, containing enhanced Indium/Gallium/Aluminum grain boundary pinning, utilizing specifically engineered, optimized blend of 1% to 10% by weight POSS.

An InGaN, or an InAlN or an InGaAlN multi-junction ASEC device manufactured/grown employing energetic neutral atom beam epitaxy, containing enhanced Indium/Gallium/Aluminum grain boundary pinning, utilizing specifically engineered, optimized blend of 1% to 10% by weight POSS, and deposition of a strategically oriented quantum dot matrix.

An InGaN, or an InAlN or an InGaAlN multi-junction ASEC device manufactured/grown employing energetic neutral atom beam epitaxy, containing enhanced Indium/Gallium/Aluminum grain boundary pinning, utilizing specifically engineered, optimized blend of 1% to 10% by weight POSS, and deposition of a strategically oriented quantum dot matrix and tunnel junction electrical contact comprised of specific InN enhanced doping.

An InGaN, or an InAlN or an InGaAlN multi-junction ASEC device manufactured/grown employing energetic neutral atom beam epitaxy, containing enhanced Indium/Gallium/Aluminum grain boundary pinning, utilizing specifically engineered, optimized blend of 1% to 10% by weight POSS, and tunnel junction electrical contact comprised of specific InN enhanced doping.

An InGaN, or an InAlN or an InGaAlN multi-junction ASEC device manufactured/grown employing energetic neutral atom beam epitaxy, containing enhanced Indium/Gallium/Aluminum grain boundary pinning and deposition of a strategically oriented quantum dot matrix.

An InGaN, or an InAlN or an InGaAlN multi-junction ASEC device manufactured/grown employing energetic neutral atom beam epitaxy, containing enhanced Indium/Gallium/Aluminum grain boundary pinning, deposition of a strategically oriented quantum dot matrix and tunnel junction electrical contact comprised of specific InN enhanced doping.

An InGaN, or an InAlN or an InGaAlN multi-junction ASEC device manufactured/grown employing energetic neutral atom beam epitaxy, containing enhanced Indium/Gallium/Aluminum grain boundary pinning and tunnel junction electrical contact comprised of specific InN enhanced doping.

An InGaN, or an InAlN or an InGaAlN multi-junction ASEC device manufactured/grown employing energetic neutral atom beam epitaxy, utilizing specifically engineered, optimized blend of 1% to 10% by weight POSS.

An InGaN, or an InAlN or an InGaAlN multi-junction ASEC device manufactured/grown employing energetic neutral atom beam epitaxy, utilizing specifically engineered, optimized blend of 1% to 10% by weight POSS and deposition of a strategically oriented quantum dot matrix.

An InGaN, or an InAlN or an InGaAlN multi-junction ASEC device manufactured/grown employing energetic neutral atom beam epitaxy, utilizing specifically engineered, optimized blend of 1% to 10% by weight POSS, deposition of a strategically oriented quantum dot matrix and tunnel junction electrical contact comprised of specific InN enhanced doping.

An InGaN, or an InAlN or an InGaAlN multi-junction ASEC device manufactured/grown employing energetic neutral atom beam epitaxy, utilizing specifically engineered, optimized blend of 1% to 10% by weight POSS and tunnel junction electrical contact comprised of specific InN enhanced doping.

An InGaN, or an InAlN or an InGaAlN multi-junction ASEC device manufactured/grown employing energetic neutral atom beam epitaxy and containing deposition of a strategically oriented quantum dot matrix.

An InGaN, or an InAlN or an InGaAlN multi-junction ASEC device manufactured/grown employing energetic neutral atom beam epitaxy, containing deposition of a strategically oriented quantum dot matrix and tunnel junction electrical contact comprised of specific InN enhanced doping.

An InGaN, or an InAlN or an InGaAlN multi-junction ASEC device manufactured/grown employing energetic neutral atom beam epitaxy and containing tunnel junction electrical contact comprised of specific InN enhanced doping.

An Indium-Gallium-Nitride (InGaN) multi-junction ASEC device manufactured/grown employing energetic neutral atom beam epitaxy and metal deposition method controlled by the Atomistic Design Modeler (ADM). ADM is a computer-based multi-scale modeling software package to create simulated crystalline or lattice structures controlled by dynamic boundary conditions.

Single-Junction Devices

Further embodiments of the present invention may comprise single-junction devices and methods of manufacture thereof, including: An InGaN, or an InAlN or an InGaAlN Single-Junction ASEC device manufactured/grown employing energetic neutral atom beam epitaxy and metal deposition or similar epitaxial growth method.

An InGaN, or an InAlN or an InGaAlN single-junction ASEC device manufactured/grown employing energetic neutral atom beam epitaxy and metal deposition, containing enhanced Indium/Gallium/Aluminum grain boundary pinning.

An InGaN, or an InAlN or an InGaAlN single-junction ASEC device manufactured/grown employing energetic neutral atom beam epitaxy and metal deposition, containing enhanced Indium/Gallium/Aluminum grain boundary pinning, utilizing specifically engineered, optimized blend of 1% to 10% by weight POSS.

An InGaN, or an InAlN or an InGaAlN single-junction ASEC device manufactured/grown employing energetic neutral atom beam epitaxy and metal deposition, containing enhanced Indium/Gallium/Aluminum grain boundary pinning, utilizing specifically engineered, optimized blend of 1% to 10% by weight POSS, and deposition of a strategically oriented quantum dot matrix.

An InGaN, or an InAlN or an InGaAlN single-junction ASEC device manufactured/grown employing energetic neutral atom beam epitaxy and metal deposition, containing enhanced Indium/Gallium/Aluminum grain boundary pinning and deposition of a strategically oriented quantum dot matrix.

An InGaN, or an InAlN or an InGaAlN single-junction ASEC device manufactured/grown employing energetic neutral atom beam epitaxy and metal deposition, utilizing specifically engineered, optimized blend of 1% to 10% by weight POSS.

An InGaN, or an InAlN or an InGaAlN single-junction ASEC device manufactured/grown employing energetic neutral atom beam epitaxy and metal deposition, utilizing specifically engineered, optimized blend of 1% to 10% by weight POSS and deposition of a strategically oriented quantum dot matrix.

An InGaN, or an InAlN or an InGaAlN single-junction ASEC device manufactured/grown employing energetic neutral atom beam epitaxy and metal deposition and containing deposition of a strategically oriented quantum dot matrix.

An InGaN, or an InAlN or an InGaAlN single-junction ASEC device manufactured/grown employing energetic neutral atom beam epitaxy method.

An InGaN, or an InAlN or an InGaAlN single-junction ASEC device manufactured/grown employing energetic neutral atom beam epitaxy, containing enhanced Indium/Gallium/Aluminum grain boundary pinning.

An InGaN, or an InAlN or an InGaAlN single-junction ASEC device manufactured/grown employing energetic neutral atom beam epitaxy, containing enhanced Indium/Gallium/Aluminum grain boundary pinning, utilizing specifically engineered, optimized blend of 1% to 10% by weight POSS.

An InGaN, or an InAlN or an InGaAlN single-junction ASEC device manufactured/grown employing energetic neutral atom beam epitaxy, containing enhanced Indium/Gallium/Aluminum grain boundary pinning, utilizing specifically engineered, optimized blend of 1% to 10% by weight POSS, and deposition of a strategically oriented quantum dot matrix.

An InGaN, or an InAlN or an InGaAlN single-junction ASEC device manufactured/grown employing energetic neutral atom beam epitaxy, containing enhanced Indium/Gallium/Aluminum grain boundary pinning and deposition of a strategically oriented quantum dot matrix.

An InGaN, or an InAlN or an InGaAlN single-junction ASEC device manufactured/grown employing energetic neutral atom beam epitaxy, utilizing specifically engineered, optimized blend of 1% to 10% by weight POSS.

An InGaN, or an InAlN or an InGaAlN single-junction ASEC device manufactured/grown employing energetic neutral atom beam epitaxy, utilizing specifically engineered, optimized blend of 1% to 10% by weight POSS and deposition of a strategically oriented quantum dot matrix.

An InGaN, or an InAlN or an InGaAlN single-junction ASEC device manufactured/grown employing energetic neutral atom beam epitaxy and containing deposition of a strategically oriented quantum dot matrix.

DETAILED DESCRIPTION

Figure 1A:
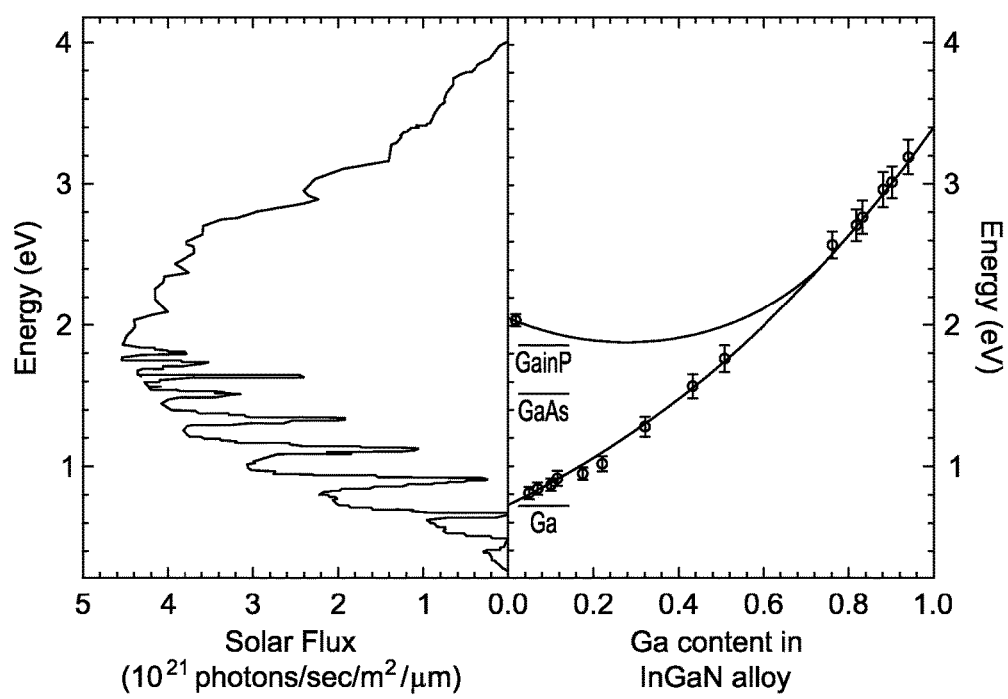
FIGS. 1A and 1B are graphs illustrating measured InGaN alloy band gaps over the solar spectrum.

It is to be understood that the figures and descriptions of the present invention have been simplified to illustrate elements that are relevant for a clear understanding of the present invention, while eliminating, for purposes of clarity, many other elements found in typical solar energy systems, such as semiconductor-based solar cells. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present invention are directed to ASECs, including high-efficiency solar cells. More specifically, embodiments include enhanced InGaN, or an InAlN, or an InGaAlN semiconductor-based solar devices. These embodiments address three (3) discriminators generally linked to improving solar cell efficiencies. When the discriminators are leveraged/combined together into a single device according to embodiments of the present invention, the overall device efficiency is expected to reach and/or exceed 60%. The three device discriminators are band gap energy, grain boundary formation, and photon absorption. Embodiments of the present invention utilize, for example, tuned Indium/Gallium compositions, POSS materials, and advanced surface features, such as carbon nanotubes (CNTs) and/or quantum dots, to realize improvements in each of the three areas of discrimination.

Figure 1B:
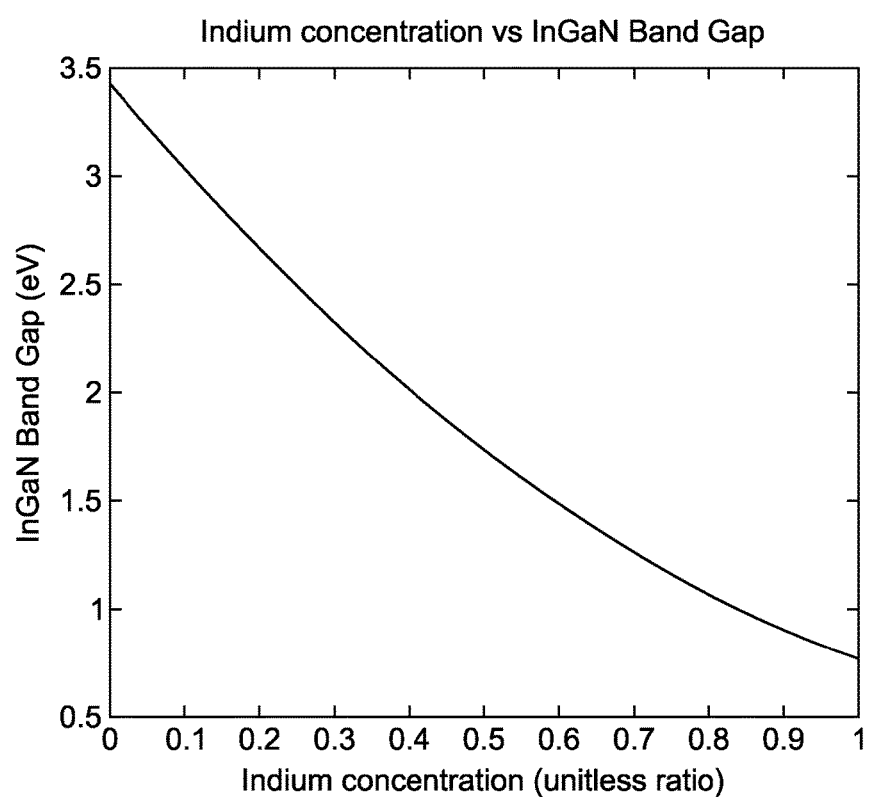

For the first discriminator, negatively and positively doped Indium (In), Gallium (Ga), Aluminum (Al) and Nitrogen (N), in a combination supporting InGaN, or an InAlN, or an InGaAlN, will be deposited onto a substrate to optimally cover the solar spectrum, expanding the standard band gap achievable in commercially-available solar cells (approximately 1.3-1.7 eV). Replacing the semiconductor material used to produce these cells with the InGaN, or InAlN, or the InGaAlN alloy creates multi-layered platform wherein each alloy metal absorbs photon energy within specific overlapping energy bands, and increases photon energy absorption in the UV and IR range. Referring generally to FIGS. 1A-B, the InGaN, or InAlN, or the InGaAlN alloys according to embodiments of the present invention absorbs photon energy within specific overlapping energy bands such that photon energy absorption is increased to approximately 3.4 eV in the UV range, and decreased to 0.7 eV in the IR range. These band gap energies virtually cover the full spectrum of sunlight for improved energy absorption. Accordingly, the individual semiconductor layers of embodiments of the present disclosure will be uniquely doped with varying material concentrations to enable photon absorption across this energy band gap.

Figure 4:
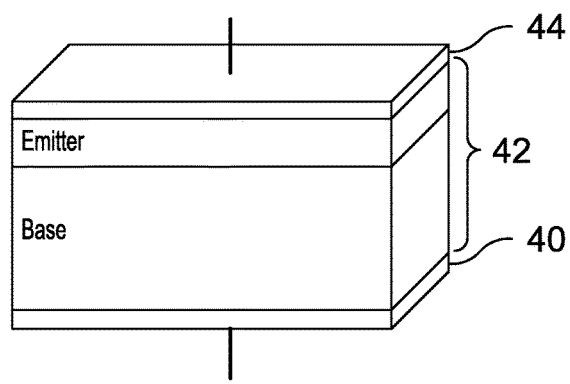
FIG. 4 is a notional cross-sectional view of an exemplary single-junction solar cell according to an embodiment of the present invention.

Referring now to FIG. 4, there is shown a single junction the InGaN, or InAlN, or the InGaAlN solar cell configuration according to an exemplary embodiment of the present invention. The InGaN, or InAlN, or the InGaAlN semiconductor device of FIG. 4 includes a substrate layer 40 and an active InGaN, or InAlN, or the InGaAlN layer 42 disposed thereon. Active layer 42 comprises a positively-doped base layer and a negatively-doped emitter layer. An absorption-enhancing or anti-reflective layer 44 may also be provided for increasing photon propagation into active layer 42. As shown in FIG. 4, absorption-enhancing layer 44 is disposed directly on the emitter layer portion of active layer 42.

Figure 5:
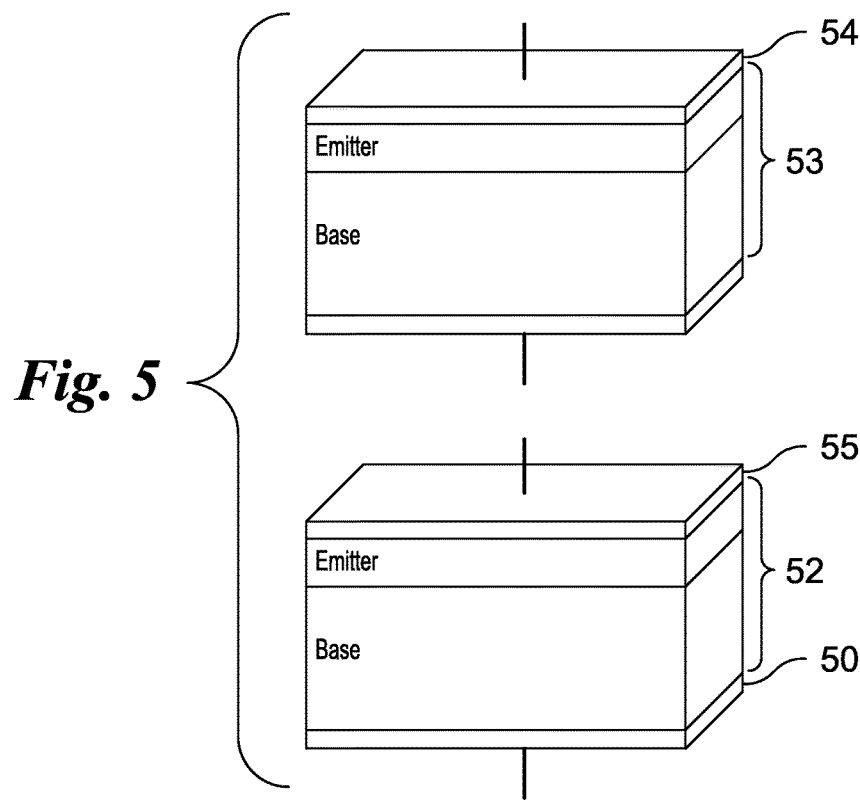
FIG. 5 is a notional exploded cross-sectional view of an exemplary dual-junction solar cell according to an embodiment of the present invention.

In similar fashion, FIG. 5 shows an InGaN, or InAlN, or the InGaAlN solar cell device comprising a multi-junction device. The device of FIG. 5 includes a substrate layer 50, a first active layer 52 comprising oppositely-doped base and emitter layers, a second active layer 53, and an absorption-enhancing layer 54. A low-resistance tunnel junction 55 may also be provided between active layers 52, 53.

With reference again to FIG. 1B and FIG. 10 maximizing (or tuning) the Indium/Gallium/Aluminum composition (richness) results in the widest p-n junction acceptance window for incoming photons and improved conditions for photon/electron collisions/energy exchanges while minimizing lattice mismatch. Depending on the application, absorption of IR light can be optimized using an Indium-rich mixture (typical solar cell application), while absorption of UV light can be optimized using a Gallium-rich mixture (useful, for example, in space-based solar cell applications). Moreover, the compositions of each active layer in a multi-junction device, or the relative composition within a single active layer of either single of multi-junction devices, may be varied independently, further optimizing each layer, or portion thereof, for a desired acceptance window.

Traditional methods of production of semiconductor devices employing InGaN have been limited by conventional high temperature epitaxial methods which can lead to vaporization of the Indium metal matrix (e.g. thermal deposition techniques, such as molecular beam epitaxy (MBE)). Recent advancements in semiconductor reactors capable of lower temperature deposition techniques (e.g. energetic neutral atom beam lithography and epitaxy (ENABLE)) have made it possible to prepare an InGaN semiconductor device without the associated loss of the Indium metal matrix. However, in order to take the maximum advantage of the neutral atom beam epitaxy process, this invention will engage an ADM. ADM has growth design tools to replicate a device growth synthesis, minimize defect migration, determine the optimized material usage and definitize carrier performance in the semiconductor. Using this ADM, a process to design is created which allows for a significantly "cleaner" device that reduces impurities, such as organic contaminants, by individual atomic level deposition/growth.

Regarding the second discriminator, typical semiconductors that utilize a deposited metal matrix often result in natural/random grain boundary formation. This random formation of varying-size grain boundaries can adversely affect the matrix material strength and energy transition within the device. Embodiments of the present invention introduce certain POSS materials to be specifically formulated for Indium, Gallium, Aluminum and Nitrides inclusion within the semiconductor into the semiconductor alloys prior to their final formation as a metal compound. In one embodiment, POSS additives will be atomized into the base metal while the base metal material is in powder form. Prior to applying the POSS and base metal mixture material onto the semiconductor substrate, it is expected that the POSS additive will vaporize during the ENABLE process without leaving any significant organic contaminates. In one embodiment, an optimized blend of 1% to 10% POSS by weight to the Indium-Gallium metals may be desired. Exemplary POSS compounds include, but are not limited to TH1550 Mercaptopropylisobutyl POSS, SO1458 Trisilanolphenyl POSS, AM0273 Aminopropylphenyl POSS, TH1555 Mercaptopropylisooctyl POSS, SO1440 Disilanolisobutyl POSS, SO1455 Trisilanolisooctyl POSS, SO1460 Tetrasilanolphenyl POSS, SH1310 Octasilane POSS, SO1450 Trisilanolisobutyl POSS, and any combinations thereof.

Figure 2A:
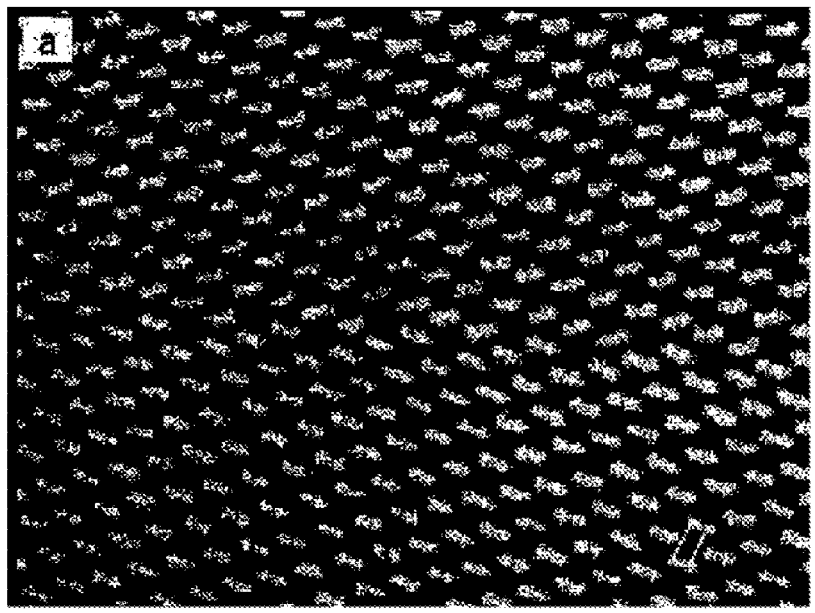
FIGS. 2A and 2B are magnified views of grain boundaries along the longitudinal axis of a silicon semiconductor.
Figure 2B:
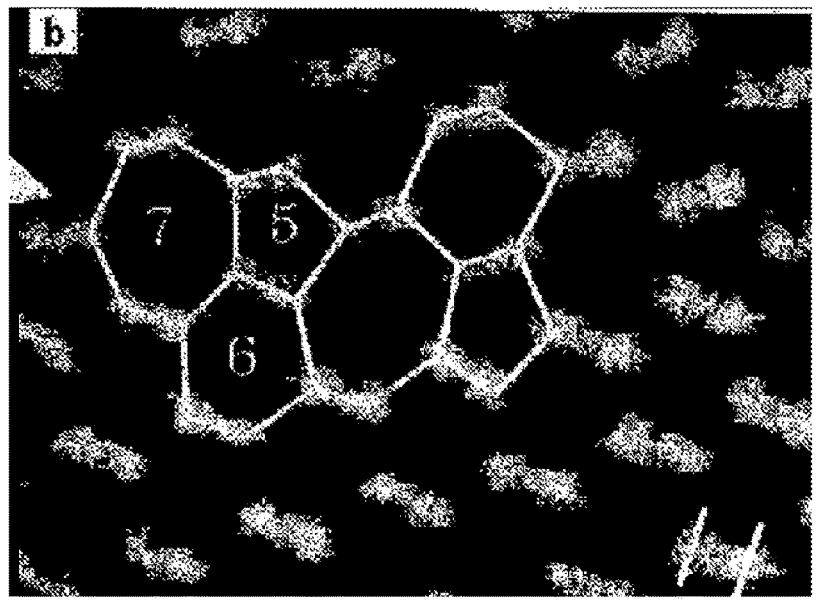

When introduced in this fashion, the inherent properties of POSS have been shown to create a more uniform polycrystalline grain symmetry, resulting in a more stable semiconductor layer and a stronger host metal. More specifically, and referring generally to FIGS. 2A and 2B, POSS introduction into the alloy allows for grain boundary tuning. For example, the homogeneous compound matrix formation aligns grain boundaries to "key" alloy metals together and results in a reduction in alloy dislocations. As these dislocations decrease, alloy strength increases.

The third discriminator leverages the advantageous characteristics of CNTs, nanorods and/or nanoparticles, such as quantum dots. Embodiments of the present invention may implement sparsely incorporated single-walled CNTs, nanorods and/or quantum dots arranged onto an exposed surface of the device in a manner configured to increase the exposed semiconductor surface area, reduce the reflection of incident light, and/or induct re-emitted lower frequency photons for enhanced energy harvesting effects.

Figure 3A:
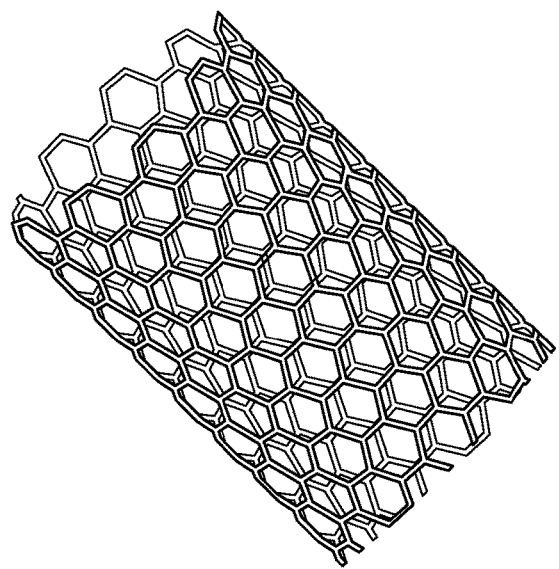
FIGS. 3A and 3B are magnified views of a single-wall carbon nanotubes and a plurality of carbon nanotubes forming a carbon nanotube "forest", respectively.

Referring generally to FIG. 3A, a representative model of a single-walled CNT is shown. CNTs are allotropes of carbon with a cylindrical nanostructure. Certain CNT configurations possess advantageous physical properties, including very high strength and a high emissivity or absorbance.

Emissivity is defined as the ratio of the energy radiated by an object compared to that of a black body. A black body is a theoretical material that absorbs all incident light (no light reflected or transmitted), at all wavelengths. Therefore, a hypothetical black body would possess an emissivity of one (1) for all wavelengths. This theoretical behavior has not been observed in any known material, as all materials necessarily reflect some portion of the EM spectrum resulting from their structure and/or composition. Materials possessing emissivity levels nearing those of true black bodies have many applications, including use in solar devices according to embodiments of the present invention.

Figure 3B:
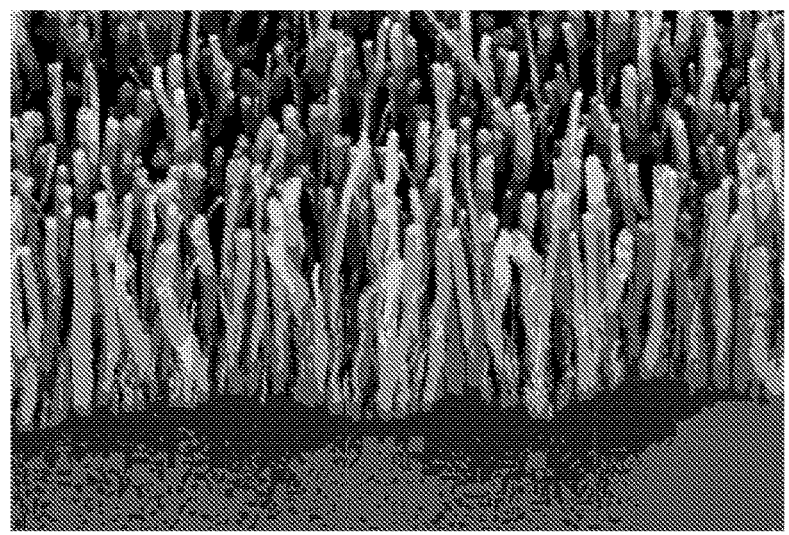

Referring generally to FIG. 3B, CNTs arranged in vertical aligned clusters or "forests" feature emissivity characteristics near to that of a theoretical black body. In some configurations, these CNT forests can have an absorbance of 0.98-0.99 from the far-ultraviolet spectrum (200 nanometers (nm)), to far-infrared spectrum (200 micrometers (um)). This emissivity is significantly higher than conventional "black" materials (e.g. super-dark coatings and paints). In addition to homogeneous sparseness, tube alignment within the CNT forest may also play a role in achieving black body behavior. CNTs which are vertically aligned perpendicular to a base substrate generally take on an angle of up to approximately twenty degrees (20°) with respect to orthogonal. Because CNTs are good absorbers over much of the EM spectrum, and this angle of tilt is relatively small, significant reflection is unlikely, and light is generally absorbed as it propagates further into the material.

By optimizing the deposition/arrangement of single, double or multi-walled CNT, virtually no photons approaching the surface of the device will be reflected. Moreover, single/double-wall CNTs can be orthogonally arranged to emulate a "directed conduit" to increase the flow efficiency of photons entering directly onto the p-n junction metal matrix.

In addition to CNTs, photonic collection may be improved using nanoparticles, such as quantum dots, deposited on the semiconductor surface. Quantum dots may also increase the opportunity for photon/electron collisions/energy exchanges, as well as minimizing photon surface recombination (surface passivation). The expected decrease in the reflectivity of light on the surface utilizing these dots is estimated to result in a reflectivity of less than 04%.

Figure 6:
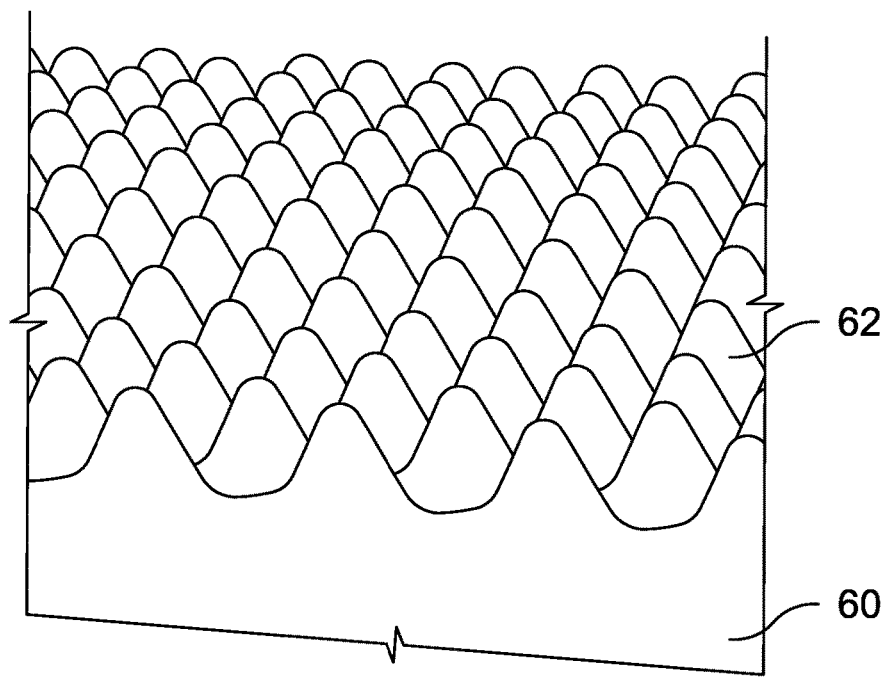
FIG. 6 is a magnified notional view of an exemplary semiconductor base layer formed with protruding nodules according to an embodiment of the present invention.

With reference to FIG. 6, to further improve the InGaN, or InAlN, or the InGaAlN devices according to embodiments of the present invention, a base substrate 60 of the semiconductor (e.g. silicon carbide (SiC), sapphire, gallium nitride (GaN), aluminum nitride (AlN)) may be manufactured with strategically placed, protruding nodules 62 defined in substrate 60. In this way, subsequent layers of material applied to undulating base layer 60 will exhibit a similar undulating surface characteristic to that of base layer 60. These nodules, combined with the CNT and/or quantum dot deposition, create a unique arching design to maximize surface area of the exposed top layer of the device (e.g. layers 44 and 54 of FIGS. 4 and 5, respectively), and thus increase photon incursion. It should also be understood that these nodules may also be formed only on exposed layers of the device, rather than on the base layer.

Embodiments of the present invention may further include the manufacture of a multi-junction version of this ASEC device having a thin deposition in the range of, by way of non-limiting example only, 10 to 100 angstroms in thickness, of InN in order to provide an extremely low resistance tunnel junction layer contact, thus eliminating the need for a traditional ohmic interface. For example, the device of FIG. 5 may comprise a tunnel junction layer 55 comprising a deposition of InN.

Figure 7:
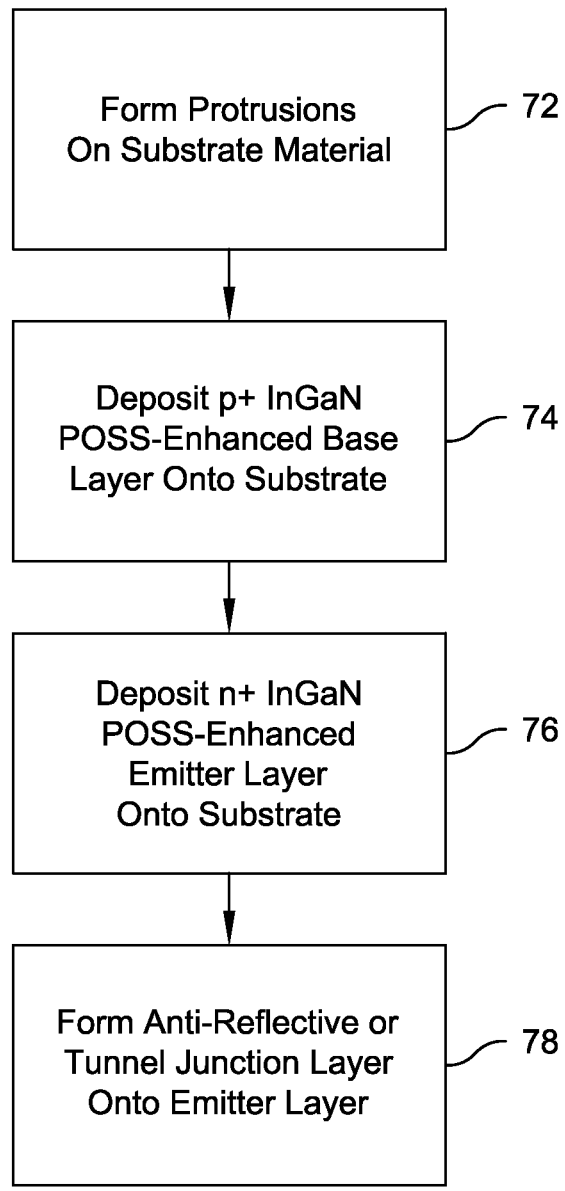
FIG. 7 is a notional process-flow diagram illustrating an exemplary method of manufacturing a solar cell according to an embodiment of the present invention.

Referring generally to FIG. 7, an exemplary process 70 of making an InGaN solar cell device according to an embodiment of the present invention is shown. This process would likewise be utilized for the InAlN, or the InGaAlN solar cell. In the illustrated process, step 72 includes the formation of surface features, such as protruding nodules, on a substrate or base layer of the semiconductor device. In step 74, a first material of an active layer of the device may be deposited onto the substrate. For example, a positively-doped InGaN alloy enhanced with the above-described POSS material may be applied to the substrate. In step 76, a second material of the active layer of the device, such as a negatively-doped InGaN alloy enhanced with the POSS material, may be applied onto the first material layer. With reference to step 78, in the case of a single-junction device, an anti-reflective layer, such as a layer including the deposition of quantum dots thereon, may be applied to the second material layer. In the case of a multi-junction device, a tunnel junction comprising, for example, a thin InN layer may be deposited on the second material layer, providing for a low-loss junction between the second material layer of the device, and subsequent material layers deposited thereon.

Figure 8:
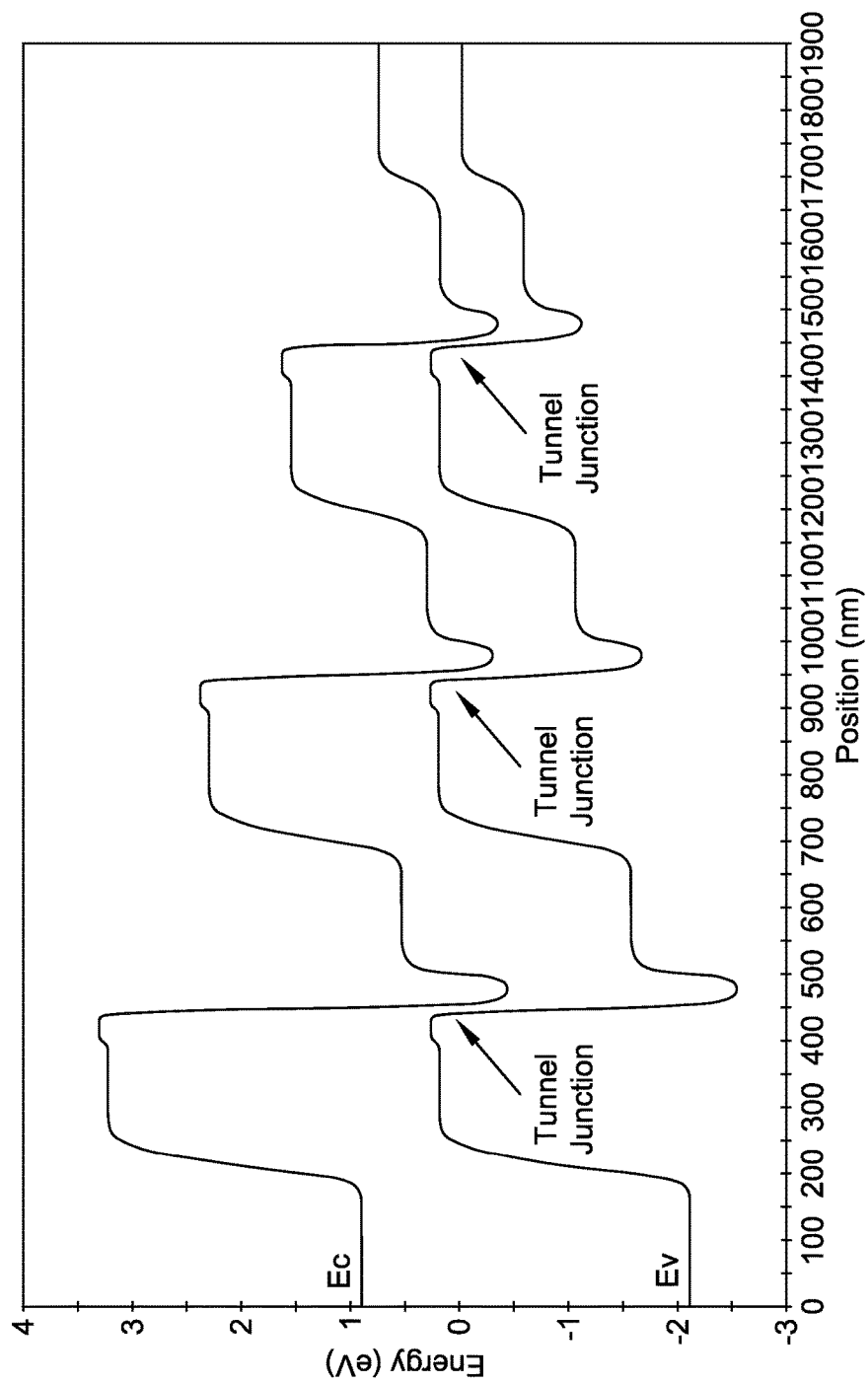
FIG. 8 is a simulated band profile for an InGaN, or an InAlN, or an InGaAlN multi-junction cell where potential tunnel junctions are identified.

Referring generally to FIG. 8, an exemplary process for generating a multi-junction solar cell is represented, including the position of tunnel junctions relative to conduction band energy ($E_c$) and valance band energy ($E_v$). Performance of these cells are contingent on effective photon energy transfer from the IR though the UV energy spectrum within the layers of the cell. Multi-junction solar cells comprised of InGaN, or InAlN, or the InGaAlN according to embodiments of the present disclosure may be manufactured with varying doping concentrations of In, Ga, Al, and N to generate p-n junctions within the cell. In the specific tunnel junction layers, providing a point for photon energy transfer between the various layers of the solar cell, doping concentrations will be optimized to minimize the resistivity between each of the doped layers of the cell.

Figure 9:
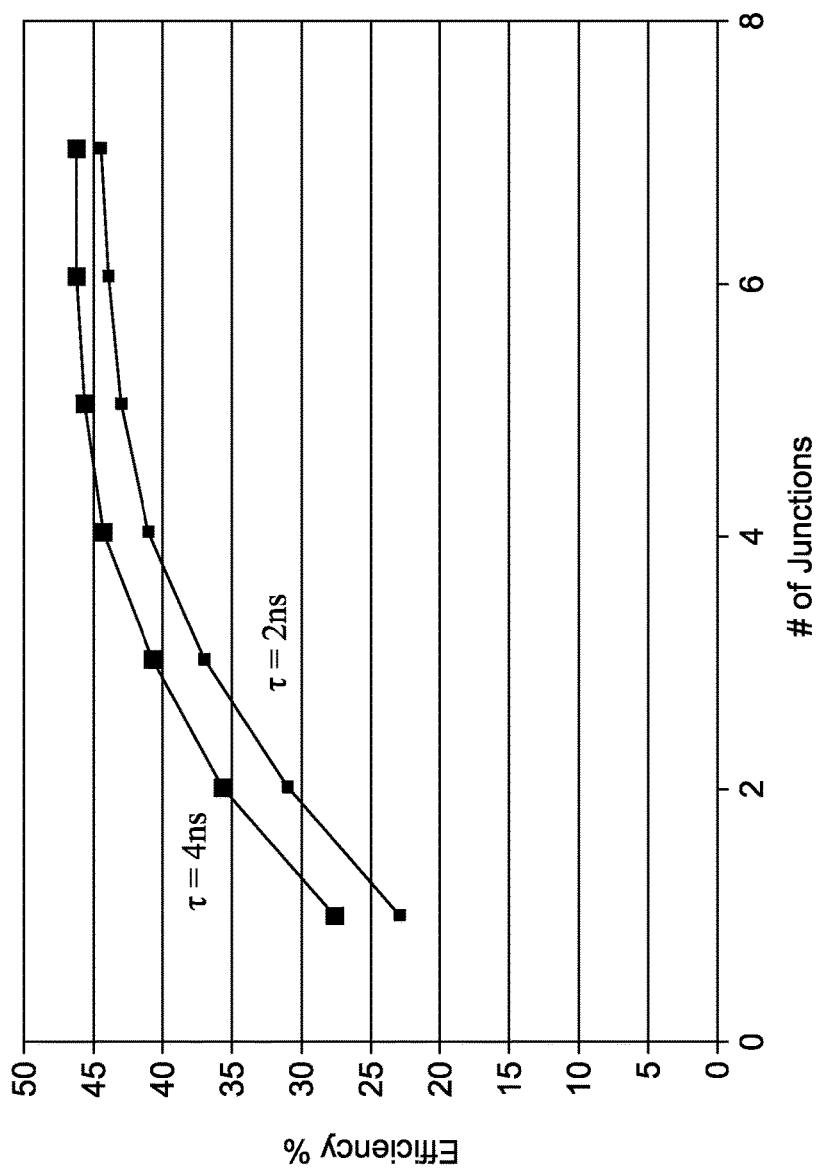
FIG. 9 is a graph of the expected minority carrier lifetimes tied to the efficiency of an InGaN, or an InAlN, or an InGaAlN multi-junction cell according to embodiments of the present description.
Figure 10:
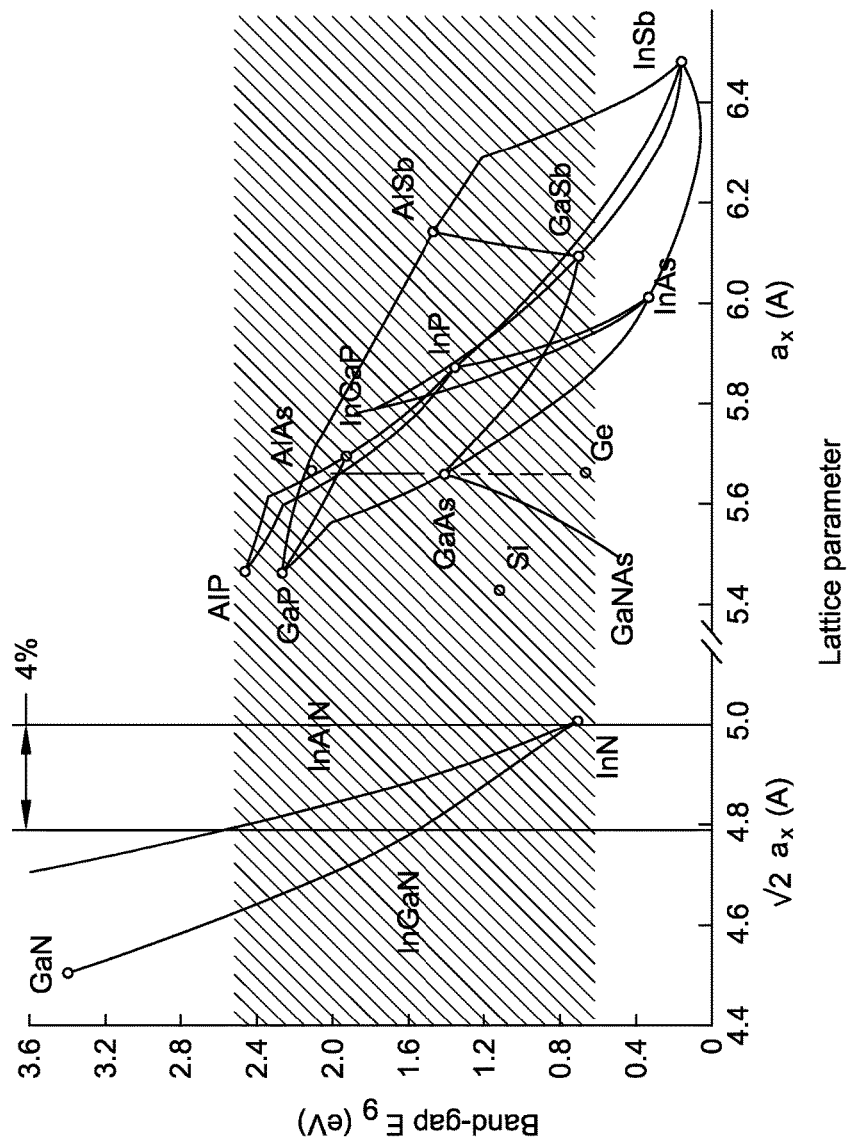
FIG. 10 is a chart representing the potential lattice mismatch utilizing an InGaN, or an InAlN, or an InGaAlN multi-junction cell.

Referring generally to FIGS. 9 and 10, the multi-junction solar cell potential efficiency of embodiments of the present disclosure is tied to the number of layers/junctions as well as the purity of the semiconductor cell layers. The lower the number of In, Ga, Al or N element discontinuities within each of the layers of the cell leads to a higher minority carrier lifetime (see FIG. 9) of the device. Similarly, the effective photon energy transfer between cell layers is also contingent on the reduction of the lattice mismatch between the semiconductor materials. Referring generally to FIG. 10, the semiconductor materials shown create the smallest lattice mismatch within the radiation hardened material band of elements bordered by the InN, InAlN and InGaN to improve photon energy transfer and increase minority carrier lifetimes.

In view of the foregoing, embodiments of the present invention include single-junction and multi-junction InGaN, or InAlN, or the InGaAlN solar cells manufactured/grown using, by way of example only, an energetic neutral atom beam epitaxy and metal deposition process performed by the ADM.

Further embodiments of the present invention include single-junction and multi-junction InGaN, or InAlN, or the InGaAlN solar cells manufactured/grown using, by way of example only, energetic neutral atom beam epitaxy, or energetic neutral atom beam epitaxy and metal deposition controlled by the ADM comprising enhanced Indium/Gallium/Aluminum grain boundary pinning utilizing an optimized blend of 1% to 10% by weight POSS.

Embodiments of the present invention may further utilize at least one of carbon nanotubes or carbon dots on an exposed surface of the device. For example, single and multi-junction InGaN, or InAlN, or the InGaAlN solar cell devices may be provided which are manufactured/grown using, by way of example only, energetic neutral atom beam epitaxy, or energetic neutral atom beam epitaxy and metal deposition controlled by the ADM comprising a deposition of a quantum dot matrix or CNT forest.

Embodiments of the present invention may include devices which include reduced tunnel junction resistance. For example, single and multi-junction InGaN, or InAlN, or the InGaAlN solar cells may be provided which are manufactured/grown using, by way of example only, energetic neutral atom beam epitaxy, or energetic neutral atom beam epitaxy and metal deposition controlled by the ADM containing a tunnel junction electrical contact comprising an InN-enhanced deposition.

Finally, hybrid devices may implement multiple performance enhancing features. Embodiments of hybrid InGaN devices include:

Single and multi-junction InGaN, or InAlN, or the InGaAlN solar cells which are manufactured/grown using, by way of example only, energetic neutral atom beam epitaxy, or energetic neutral atom beam epitaxy and metal deposition controlled by the ADM, comprising enhanced Indium/Gallium/Aluminum grain boundary pinning utilizing an optimized blend of 1% to 10% by weight POSS and a deposition of a quantum dot matrix.

Single and multi-junction InGaN, or InAlN, or the InGaAlN solar cells are disclosed which are manufactured/grown using, by way of example only, energetic neutral atom beam epitaxy, or energetic neutral atom beam epitaxy and metal deposition controlled by the ADM, comprising an enhanced Indium/Gallium/Aluminum grain boundary pinning utilizing an optimized blend of 1% to 10% by weight POSS and a tunnel junction electrical contact comprising an InN-enhanced deposition.

Single and multi-junction InGaN, or InAlN, or the InGaAlN solar cells are disclosed which are manufactured/grown using, by way of example only, energetic neutral atom beam epitaxy, or energetic neutral atom beam epitaxy and metal deposition controlled by the ADM, comprising a deposition of a quantum dot matrix and a tunnel junction electrical contact comprising an InN-enhanced deposition.

Finally, single and multi-junction InGaN, or InAlN, or the InGaAlN solar cells are disclosed which are manufactured/grown using, by way of example only, energetic neutral atom beam epitaxy, or energetic neutral atom beam epitaxy and metal deposition controlled by the ADM, comprising an enhanced Indium/Gallium/Aluminum grain boundary pinning utilizing an optimized blend of 1% to 10% by weight POSS, a deposition of a quantum dot matrix and a tunnel junction electrical contact comprising an InN-enhanced deposition.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A semiconductor structure useful for forming a solar cell comprising:
    a substrate;
    at least one active layer formed from a homogenous compound of Indium Gallium Aluminum Nitride (InGaAlN) powder and a polyhedral oligomeric silsesquioxane (POSS) material atomized into the InGaAlN powder for aligning grain boundaries of the at least one active layer after vaporizing the POSS material; and
    an absorption-enhancing layer for increasing photon propagation into the at least one active layer.

2. The semiconductor structure of claim 1, wherein the at least one active layer is formed by adding 1% to 10% POSS by weight to the InGaAlN powder.

3. The semiconductor structure of claim 1, wherein the absorption-enhancing layer comprises at least one of carbon nanotubes (CNTs) and quantum dots disposed on a surface of the at least one active layer.

4. The semiconductor structure of claim 1, wherein the substrate includes nodules formed thereon, and wherein the at least one active layer is uniformly disposed on said substrate to define an undulating layer.

5. The semiconductor structure of claim 4, wherein the absorption-enhancing layer is formed on the at least one active layer and defines a second undulating layer.

6. The semiconductor structure of claim 1, wherein the at least one active layer is doped to enable photon absorption across a bandgap from approximately 0.7 electron Volt (eV) to 3.4 eV.

7. The semiconductor structure of claim 1, wherein the absorption-enhancing layer comprises carbon nanotubes (CNTs) disposed on a surface of the at least one active layer.

8. The semiconductor structure of claim 7, wherein the CNTs comprise single-walled CNTs.

9. The semiconductor structure of claim 7, wherein the CNTs are oriented generally perpendicular with respect to the surface of the at least one active layer.

10. The semiconductor structure of claim 1, wherein the absorption-enhancing layer comprises carbon nanotubes (CNTs) and quantum dots disposed on a surface of the at least one active layer.

11. The semiconductor structure of claim 1, wherein the absorption-enhancing layer comprises quantum dots disposed on a surface of the at least one active layer.

12. The solar cell of claim 1, wherein the at least one active layer comprises: a positively-doped base layer; and
    a negatively doped emitter layer.

* * * * *